US005952619A

United States Patent [19]

Kantor et al.

[11] Patent Number: 5,952,619

[45] Date of Patent: Sep. 14, 1999

[54] IN-CEILING LOUDSPEAKER

[75] Inventors: Kenneth Kantor; William Bush; Jay Doherty, all of Benicia, Calif.

[73] Assignee: Recoton Corporation, Lake Mary, Fla.

[21] Appl. No.: 09/183,747

[22] Filed: Oct. 30, 1998

[51] Int. Cl.[6] .......................................................... H05K 5/00

[52] U.S. Cl. ............................................ 181/150; 181/154

[58] Field of Search .................................... 181/144, 147, 181/150, 154, 199; 381/182, 386

[56] References Cited

U.S. PATENT DOCUMENTS 4,923,032 5/1990 Nuernberger ........................... 181/150

5,088,574 2/1992 Kertesz, III ............................. 181/150

*Primary Examiner*—Khanh Dang

*Attorney, Agent, or Firm*—Levisohn, Lerner, Berger & Langsam

[57] ABSTRACT

An in-ceiling loudspeaker is provided which comprises a woofer and at least three tweeters located below the woofer with respect to the ceiling with the woofer and tweeters arranged to radiate direct acoustic signals downwardly and widely spread from the loudspeaker, the three tweeters mounted at acute angles with respect to the horizontal plane which is parallel to the ceiling, the acute angle preferably being approximately 65°. The three tweeters are regularly spaced equally at 120° from each other between the axis of the tweeter and the plane of the ceiling.

17 Claims, 2 Drawing Sheets

IN-CEILING LOUDSPEAKER

This invention relates to loudspeakers for mounting in ceilings and generally known as in-ceiling loudspeakers.

The primary problem with conventional in-ceiling loudspeakers for use in high fidelity sound reproduction and public address purposes is that they exhibit limited high frequency dispersion. This is problematic for home high fidelity use because normal eight foot ceiling heights is not much higher than the standing head height five to six feet thus resulting in extreme off axis listening angles. This leads to apparent "hot spots" directly under normal in-ceiling loudspeakers and attenuated high frequency sound away from the speakers. This is also an issue in public address applications where ceiling height is usually higher, but limited high frequency dispersion is still a problem.

One common solution to this problem is to use a greater number of in-ceiling loudspeakers, each covering a smaller angle of dispersion. This solution is not cost effective and has obvious cosmetic and logistical/insulation drawbacks. This is a solution often employed for public address systems.

One prior art solution provided by a company TOA places a reflective shape underneath the driver reflecting high frequencies away from directly underneath the speaker and out around the listening area.

An object of this invention is to provide an improved in-ceiling loudspeaker providing wide dispersion and coverage of high frequency sound as well as eliminating minor hot spots developed directly underneath the speaker.

Another object of this invention is to provide such an in-ceiling speaker which is attractive to use, capable of widespread use, economical and rugged in construction.

Yet another object of this invention is to provide such an in-ceiling loudspeaker formed of conventional components.

Yet another object of this invention is to combine multiple tweeters to produce an improved in-ceiling loudspeaker.

Yet another object of this invention is to reduce the frequency cross over to the woofer so that there is less "beaming" at the upper end of the woofer's range providing wider dispersion in mid range frequencies.

Other objects, advantages and features of this invention will become more apparent from the following description.

Additionally, another manufacturer Speakercraft provides a speaker with two angled tweeters. This is functionally different from the speaker of the present invention in that the two angled tweeters of Speakercraft are used as a stereo pair providing some stereo effect with one-in-ceiling loudspeaker. The multiple tweeters within the speaker of the present invention receive the same signal which is in contrasts with the Speakercraft construction and stereo effects are achieved in the present invention by utilizing pairs of the present invention with the multiple tweeters in each set of speakers providing one portion of the stereo sound sought to be produced if stereo is desired.

The above objects are accomplished by providing an in-ceiling loudspeaker which comprises a woofer and at least three tweeters located below the woofer with respect to the ceiling with the woofer and tweeters arranged to radiate direct acoustic signals downwardly and widely spread from the loudspeaker, the three tweeters mounted at acute angles with respect to the horizontal plane which is parallel to the ceiling, the acute angle preferably being approximately 65° with respect to the axis of each tweeter with each tweeter being regularly spaced equally at 120° from the other.

DETAILED DESCRIPTION

Figure 1:
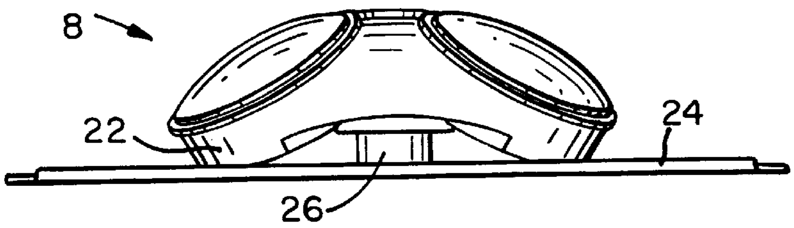
FIG. 1 is an end view of the in-ceiling speaker of the present invention without the outer housing and grill.
Figure 2:
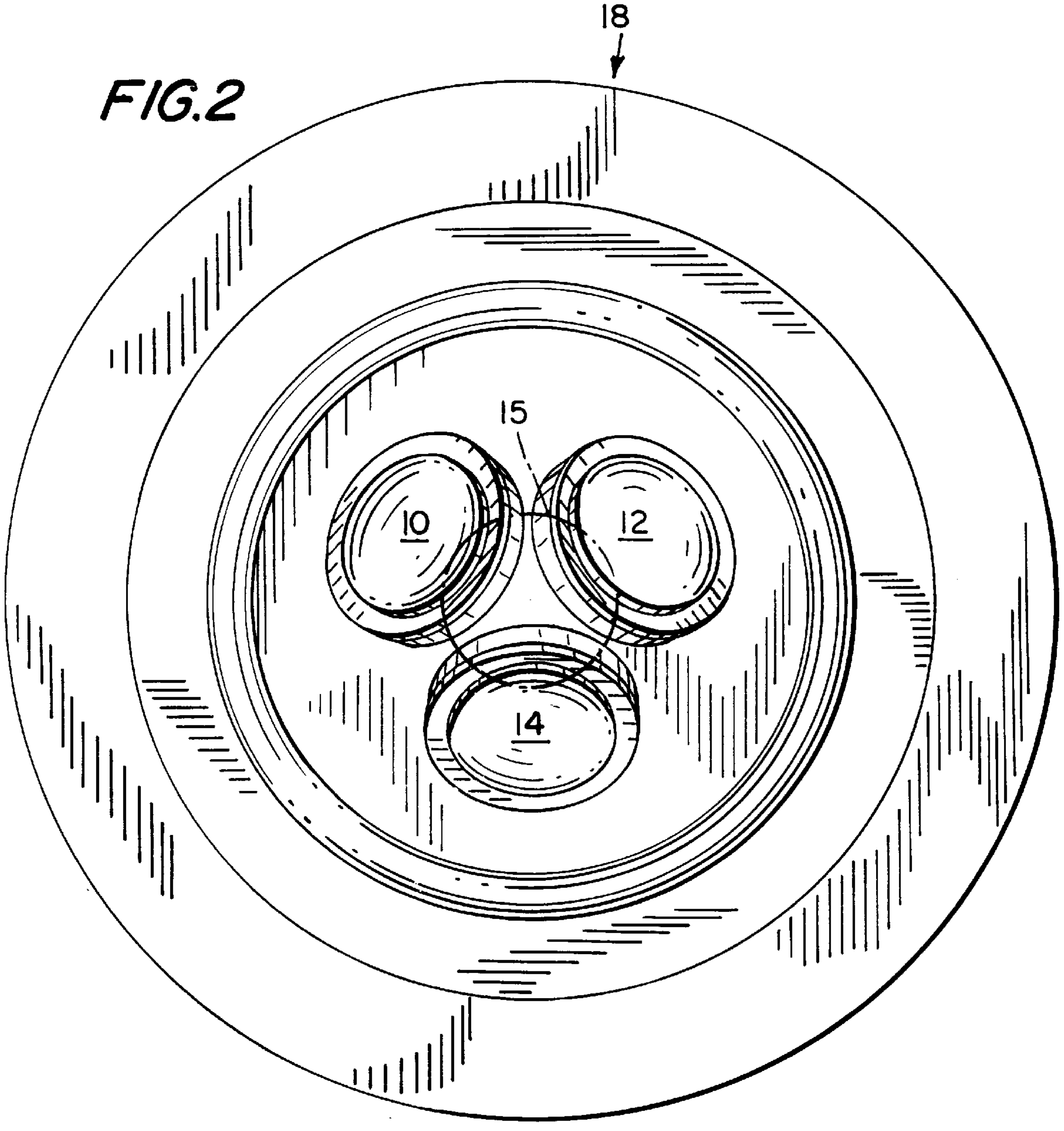
FIG. 2 is a view of the speaker of FIG. 1 from below the speaker or it could be seen from below when attached to the ceiling.
Figure 3:
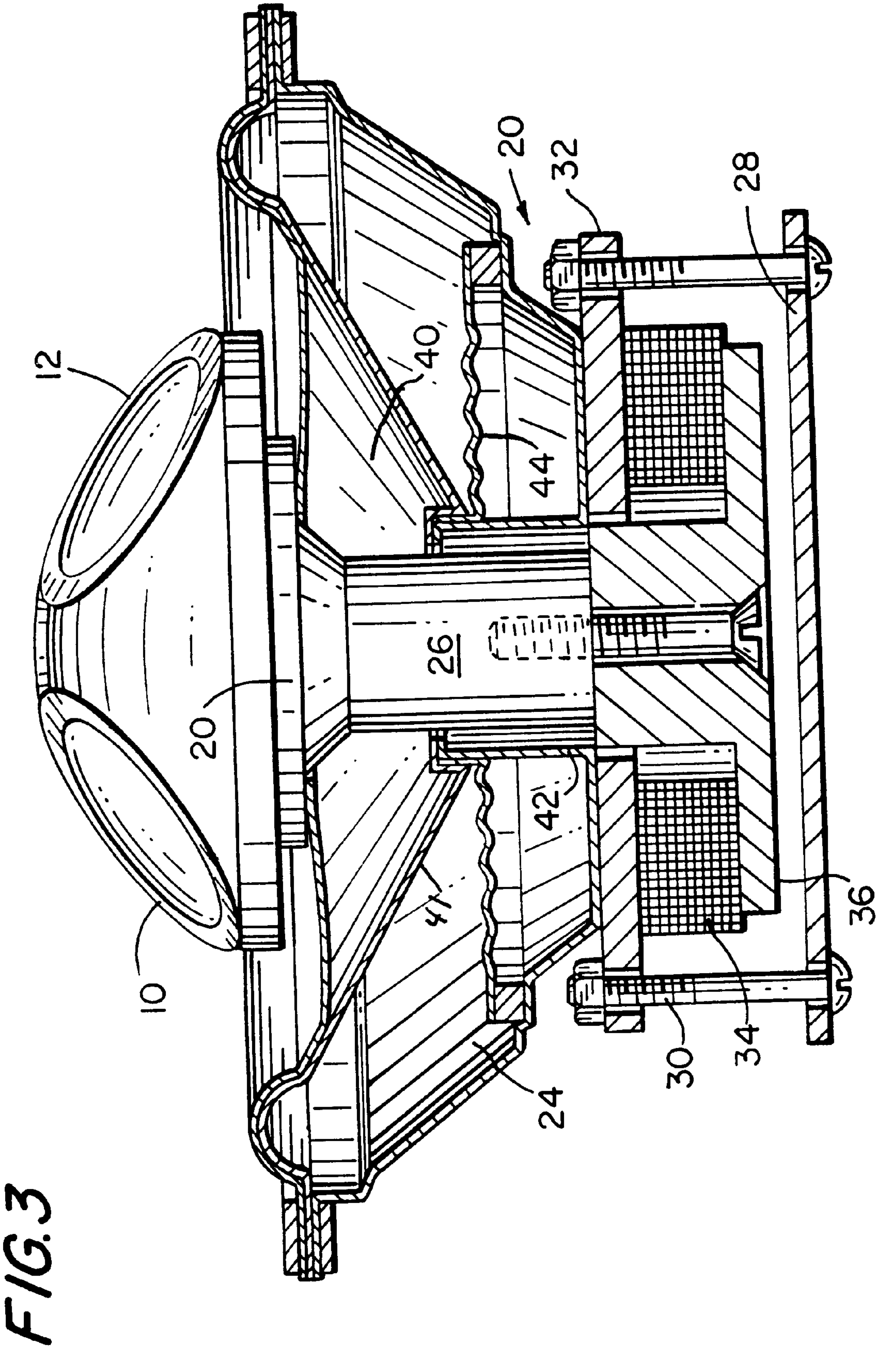
FIG. 3 is a vertical cross sectional view taken along lines of the speaker of this invention.

Referring to FIG. 3, there is shown a sectional view of the in-ceiling speaker 8 of this invention which comprises a pair of tweeters 10 and 12 with a third tweeter 14 illustrated in FIG. 1, with the plane of each tweeter mounted at a 35° acute angle with respect to a horizontal plane 16 and the axis of each tweeter mounted 65° with respect to said horizontal plane 16. The horizontal plane is parallel to the ceiling 18 to which the speaker is mounted. Each of the tweeters is radially separated from the other at equal angles of 120° and is directed downwardly at the same 65° acute angle with respect to the horizontal plane 16. A woofer 20 is located above the tweeters and projects its sound downwardly in the same general direction as tweeters 10, 12 and 14, although tweeters 10, 12 and 14 tend to directly spread their acoustic waves over a wide angle of direct radiation. A housing 22 is provided so that each of the tweeters is seated and fits into a respective molded receptacle, thereby fixing its preset angular position with each tweeter separated radially from each other by 120°. A frame 24 is provided to which the structure is attached which is attachable to the ceiling 18. An additional support structure 26 is provided connecting the tweeter assembly to the overall speaker housing to provide an integrated integral unit.

Each in-ceiling speaker 8 includes a cross-over circuit board 28 connected at the upper portion of the speaker with respect to the ceiling which is physically attached as by a pair of threaded nut and bolt arrangements 30 connecting the cross over circuit board to top plate 32. The woofer speaker 20 is conventionally mounted and is hidden in the ceiling during normal use with only the tweeters located below the ceiling and being visible. An annular magnet 34 is located between plate 36 and top plate 32. The tweeter array support 26 is secured into the housing for woofer speaker 20. A conventional annular cone 40 is connected to frame 42 and voice coil 42' and a spider 44 are included in the woofer speaker assembly in the conventional manner.

The use of the three tweeters aligned as described above can lead to a "hot spot" directly under the speaker. A hot spot is where the acoustic sum of the three tweeters produces an undesirable high frequency amplitude sound. A foam absorption pad 15 may be placed over the center area between the three tweeters and it overlaps the three tweeters to dampen the sound and lessen the "hot spot" effect.

This invention has been described with respect to a preferred embodiment, and other embodiments of this invention may be provided by those of ordinary skill in the art which fall within the teachings of this invention as set forth in the appended approved claims.

What is claimed:

1. An in-ceiling loudspeaker mounted in a ceiling, said in-ceiling loudspeaker comprising a woofer and at least three tweeters located below said woofer with respect to said ceiling, said woofer and tweeters arranged to radiate direct acoustic signals downwardly and widely spread from said loudspeaker, said at least three tweeters mounted at acute angles with respect to a horizontal plane which is parallel to the ceiling.

2. An in-ceiling loudspeaker according to claim 1, wherein said loudspeaker comprises three tweeters.

3. An in-ceiling loudspeaker according to claim 2, wherein at least two of said three tweeters are mounted at substantially the same acute angle with respect to said horizontal plane.

4. An in-ceiling loudspeaker according to claim 3, wherein all three of said tweeters are mounted at substantially the same acute angle.

5. An in-ceiling loudspeaker according to claim 4, wherein said acute angle is approximately 65° between the axis of each of said tweeter and the plane of the ceiling.

6. An in-ceiling loudspeaker according to claim 1, wherein each of said speakers is radially spaced apart from the other.

7. An in-ceiling loudspeaker according to claim 2, wherein each of said speakers is radially spaced from the other.

8. An in-ceiling loudspeaker according to claim 7, wherein each of said speakers is radially spaced equally from each other at 120° from each other.

9. An in-ceiling loudspeaker according to claim 4, wherein each of said speakers is radially spaced from the other.

10. An in-ceiling loudspeaker according to claim 4, wherein each of said speakers is radially spaced equally from each other at 120° from each other.

11. An in-ceiling loudspeaker according to claim 5, wherein each of said speakers is radially spaced equally from each other at 120° from each other.

12. An in-ceiling loudspeaker according to claim 1, wherein each of said tweeters provides sound from the same sound source.

13. An in-ceiling loudspeaker according to claim 2, wherein each of said tweeters provides sound from the same sound source.

14. An in-ceiling loudspeaker according to claim 1, further comprising a housing for accommodating said tweeters.

15. An in-ceiling loudspeaker according to claim 2, further comprising a housing for accommodating said tweeters and wherein said housing comprises molded housing comprising three apertures to accept and hold said three tweeters.

16. An in-ceiling loudspeaker according to claim 14, further comprising a foam absorber pad located between said tweeter and said ceiling to lessen any hot spots developed directly under said speaker.

17. An in-ceiling loudspeaker according to claim 8, further comprising a foam absorber pad located between said tweeter and said ceiling to lessen any hot spots developed directly under said speaker.

* * * * *